US006058427A

United States Patent [19]
Viswanath et al.

[11] Patent Number: 6,058,427
[45] Date of Patent: May 2, 2000

[54] APPARATUS AND METHOD FOR GENERATING A SERIAL DATA STREAM CARRYING DATA FOR MULTIPLE NETWORK SWITCH PORTS FOR USE BY A PHYSICAL TRANSCEIVER

[75] Inventors: Somnath Viswanath, Sunnyvale; Peter Ka-Fai Chow, San Jose, both of Calif.

[73] Assignee: Advanced Micro Devices, Inc., Sunnyvale, Calif.

[21] Appl. No.: 08/993,569

[22] Filed: Dec. 18, 1997

Related U.S. Application Data
[60] Provisional application No. 60/038,025, Feb. 14, 1997.

[51] Int. Cl.$^7$ .............................. H04L 7/00; H04L 12/00
[52] U.S. Cl. ..................... 709/231; 709/230; 709/238; 709/242
[58] Field of Search ...................................... 709/213, 215, 709/230–231, 236, 238, 242–244; 370/375–377, 400–402

[56] References Cited

U.S. PATENT DOCUMENTS

| | | | |
|---|---|---|---|
| 4,999,832 | 3/1991 | Chen et al. ............................... | 370/369 |
| 5,515,376 | 5/1996 | Murphy et al. .......................... | 370/402 |
| 5,724,347 | 3/1998 | Bell et al. ................................ | 370/377 |
| 5,734,329 | 3/1998 | Khosrowpour et al. ................. | 370/499 |
| 5,754,791 | 5/1998 | Dahlgren et al. ........................ | 709/238 |
| 5,838,959 | 11/1998 | Thomann et al. ....................... | 709/238 |

FOREIGN PATENT DOCUMENTS

| | | | |
|---|---|---|---|
| WO 96/15607 | 5/1996 | WIPO ............................ | H04L 12/44 |
| WO 96/29802 | 9/1996 | WIPO ............................ | H04L 12/44 |
| WO 97/04547 | 2/1997 | WIPO ............................ | H04L 12/56 |

OTHER PUBLICATIONS

Wright, M., "Network–switch ICs simplify design and slash per–port costs", EDN–Electrical Design News, vol. 40, no. 24, Nov. 23, 1995, pp. 53–56, 58 and 60, XP000546015.

Bursky, D., "Chip Set Delivers 100 Mbits/S to the Desktop", Electronic Design, vol. 42, no. 1, Jan. 10, 1994, pp. 45, 46, 48, 50, 55 and 56.

*Primary Examiner*—Zarni Maung
*Assistant Examiner*—Bharat Barot

[57] ABSTRACT

A network switch having multiple media access control (MAC) switch ports has a physical transceiver interface that generates a time-division multiplexed serial data stream and outputs the time-division multiplexed serial data stream to a physical layer transceiver serving a respective multiple number of network nodes. The physical transceiver interface is also configured for receiving a time-division multiplexed serial input stream from the physical transceiver according to another repeating sequence of time slots corresponding to the network switch ports, where each of the serial data streams between the physical transceiver interface and the physical layer transceiver are synchronized relative to a shared system clock and a shared reset signal. The physical transceiver interface includes a timing circuit that reconciles timing differences between the MAC switch ports and the transmission and reception of data packets by the physical layer transceiver on the network media, minimizing the necessity of buffering in the transceiver interface.

23 Claims, 6 Drawing Sheets

APPARATUS AND METHOD FOR GENERATING A SERIAL DATA STREAM CARRYING DATA FOR MULTIPLE NETWORK SWITCH PORTS FOR USE BY A PHYSICAL TRANSCEIVER

CROSS-REFERENCE TO RELATED APPLICATIONS

RELATED APPLICATIONS

This application claims priority from provisional patent application Serial No. 60/038,025, filed Feb. 14, 1997, entitled INTEGRATED MULTIPORT SWITCH (attorney docket 1033-230PRO), which is incorporated herein by reference. This application also incorporates by reference commonly-assigned, copending application Ser. No. 08/713,489, filed Sep. 13, 1996, still pending, entitled "A METHOD AND SYSTEM FOR REDUCING THE PIN COUNT REQUIRED FOR THE INTERCONNECTIONS OF CONTROLLER DEVICES AND PHYSICAL DEVICES IN A NETWORK."

TECHNICAL FIELD

The present invention relates to network switching and, more particularly, to a method and apparatus for outputting data from network switch ports to physical layer transceiver devices.

BACKGROUND ART

Switched local area networks use a switch for supplying data frames between network stations, where each network node (e.g., the network switch or a network station) includes a media access controller (MAC) that connects to network media via a physical (PHY) transceiver. In the case of a network switch having multiple network switch ports, each network switch port typically has its own dedicated MAC layer that sends and receives data packets to the corresponding dedicated PHY transceiver according to Ethernet (IEEE 802.3) protocol. In addition, each MAC/PHY connection will have multiple connections for receive data, transmit data, receive clock, transmit clock, carrier sense, transmit and receive clocks, etc. Hence, a network switch having six ports will require six individual PHY devices serving the respective network switch ports operating at the MAC layer, resulting in a linear increase in the total pin count as the number of switch ports increases. For example, a 10 Mb/s quad physical layer device connected to a quad 10 Mb/s MAC device will require a total of 28 pins, whereas octal devices will require 56 pins. This problem increases substantially for 100 Mb/s connections, where a quad 100 Mb MAC/PHY interconnect will require a total of 72 pins, and octal devices will require 144 pins. Hence, the increase in the pin count results in an increase in the package size, as well as an increase in silicon and system costs.

DISCLOSURE OF THE INVENTION

There is a need for an arrangement for transmitting data between a MAC layer and a physical transceiver in a manner that minimizes the pin count in a network switch having multiple ports, without requiring additional buffering between the MAC layer and the physical layer.

There is also a need for an arrangement that enables transmission of data from multiple network switch ports using a single serial data path, where buffering requirements are eliminated based on synchronous transmission of the serial data stream between the MAC layer and the physical transceiver.

There is also a need for an arrangement for receiving a single serial data stream carrying packet data received by a physical transceiver for multiple switch ports, where the received data can be recovered for each network switch port independent from the media transmission rate encountered by the physical transceiver during reception of the packet data.

These and other needs are attained by the present invention, where a physical transceiver interface generates an output serial data stream having a repeating sequence of time slots corresponding to the network switch ports, and outputs the serial data stream to the physical transceiver based upon a prescribed clocking protocol. The physical transceiver interface also is configured for receiving an input serial stream from the physical transceiver according to another repeating sequence of time slots corresponding to the network switch ports, and recovers for each network switch port the corresponding packet data from the input serial data stream.

According to one aspect of the present invention, a method for outputting data to a physical transceiver from a network switch having a plurality of switch ports comprises reading from each switch port into a physical transceiver interface a data element having a prescribed number of bits, mapping the data elements into a first serial data stream having groups of significant bits for the data elements, each group comprising a corresponding one of the significant bits for each of the data elements in a prescribed sequence according to the switch ports, and outputting the first serial data stream from the physical transceiver interface to the physical transceiver based on a prescribed clocking protocol shared between the physical transceiver interface and the physical transceiver. Mapping the data elements into the first serial data stream enables a substantial reduction in pin count by transmitting data from multiple network switch ports using a single serial data stream. Moreover, the output of the serial data stream based on a prescribed clocking protocol enables the physical transceiver and the physical transceiver interface to demultiplex received serial data streams with minimal signaling requirements, further minimizing the number of pins required for synchronization and control.

Another aspect of the present invention provides a method including the steps of storing data elements received from respective network switch ports in respective registers, each data element having a prescribed number of bits, generating an output serial data stream having a repeating sequence of time slots corresponding to the network switch ports, respectively, each sequence of time slots corresponding to a significant bit of the data elements stored in the registers, and outputting the output serial data stream to a physical transceiver based on a prescribed clocking protocol. Generation of the output serial data stream having the repeating sequence of time slots enables the physical transceiver to recover data from multiple switch ports based upon the corresponding sequence of time slots, while minimizing the necessary buffering by outputting the serial data stream based on a prescribed clocking protocol.

Still another aspect of the present invention provides an interface for a network switch having network switch ports, comprising a transmit portion configured for outputting a first serial data stream having a first repeating prescribed sequence of time slots corresponding to data output from the respective network switch ports, each first sequence of time slots corresponding to a significant bit of the data from the network switch ports, the transmit portion outputting the serial data stream to a physical transceiver according to a prescribed clocking protocol, a receive portion configured for receiving from the physical transceiver a second serial data stream having a second repeating prescribed sequence of time slots corresponding to packet data for the respective network switch ports, the receive portion outputting the packet data for the respective network switch ports based on the second repeating prescribed sequence of time slots and the prescribed clocking protocol, and a timing circuit for synchronizing the first and second serial data streams relative to the interface and the physical transceiver according to the prescribed clocking protocol and the physical transceiver. The transmit portion and receive portion of the interface enables transmit and receive data for multiple network switch ports to be transferred between the physical transceiver with a minimal number of pins, while the timing circuit enables transport of the serial data streams between the interface and the physical transceiver with a minimal amount of buffering.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein.

DETAILED DESCRIPTION OF ILLUSTRATED EMBODIMENTS

The present invention will be described with the example of a switch in a packet switched network, such as an Ethernet (IEEE 802.3) network. A description will first be given of the switch architecture, followed by the arrangement for outputting data for multiple switch ports on a serial data stream between a physical transceiver interface and a physical transceiver according to the present invention. It will become apparent, however, that the present invention is also applicable to other packet switched systems, as described in detail below.

SWITCH ARCHITECTURE

Figure 1:
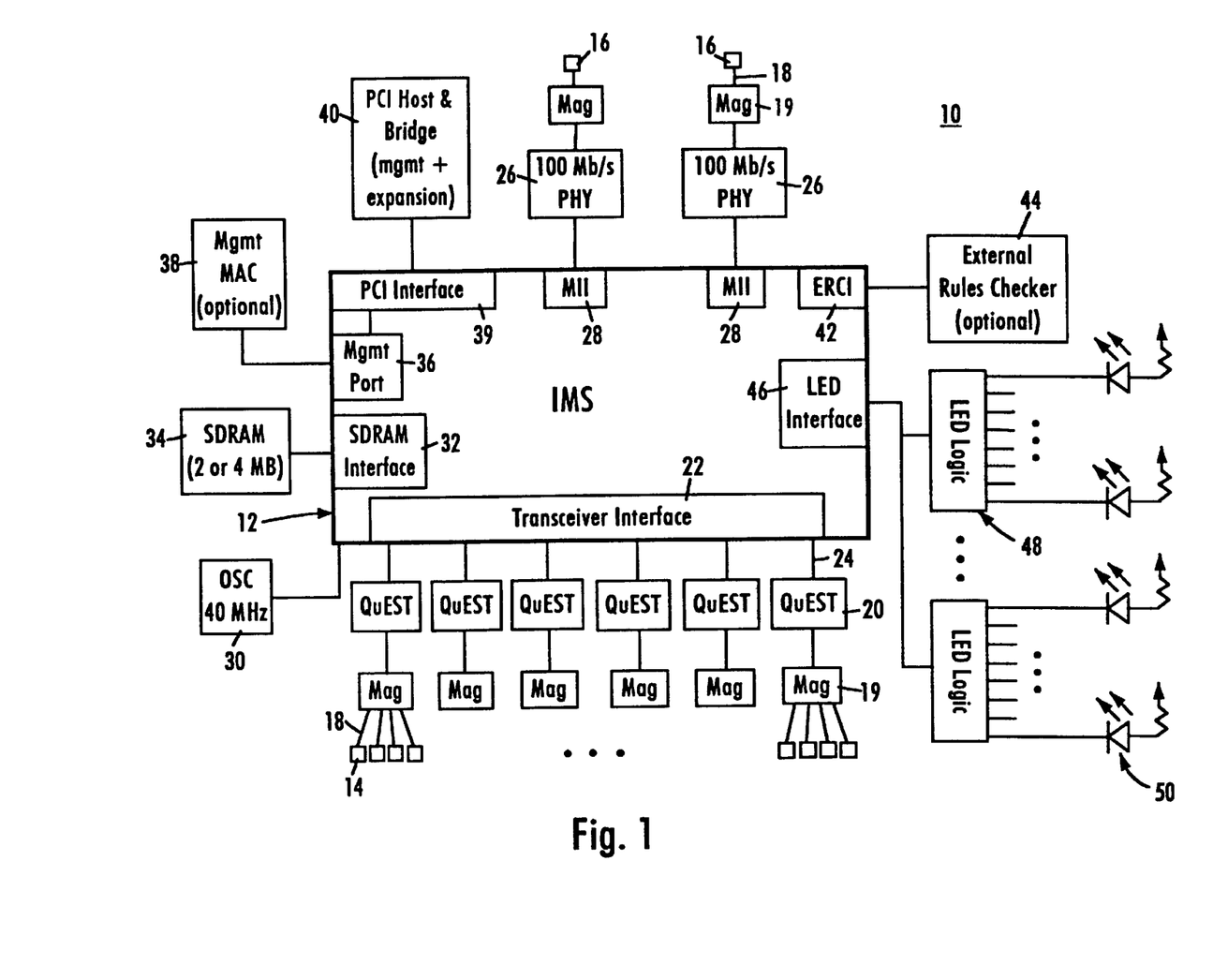
FIG. 1 is a block diagram of a packet switched system constructed in accordance with an embodiment of the present invention.

FIG. 1 is a block diagram of an exemplary system in which the present invention may be advantageously employed. The exemplary system 10 is a packet switched network, such as an Ethernet network. The packet switched network includes an integrated multiport switch (IMS) 12 that enables communication of data packets between network stations. The network may include network stations having different configurations, for example twenty-four (24) 10 megabit per second (Mb/s) network stations 14 that send and receive data at a network data rate of 10 Mb/s, and two 100 Mb/s network stations 16 that send and receive data packets at a network speed of 100 Mb/s. The multiport switch 12 selectively forwards data packets received from the network stations 14 or 16 to the appropriate destination based upon Ethernet protocol.

According to the disclosed embodiment, the 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 includes an Ethernet interface that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mb/s network stations 16 preferably operate in fill-duplex mode according to the proposed Ethernet standard IEEE 802.3x Full-Duplex with Flow Control—Working Draft (0.3). The full-duplex environment provides a two-way, point-to-point communication link between each 100 Mb/s network station 16 and the multiport switch 12, where the multiport switch 12 and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol with flow control.

As shown in FIG. 1, the network 10 includes a series of switch transceivers 20, also referred to as physical (PHY) transceivers, that perform time division multiplexing and time division demultiplexing for data packets transmitted between the multiport switch 12 and the 10 Mb/s stations 14, described in detail below. A magnetic transformer module 19 maintains the signal waveform shapes on the media 18. The multiport switch 12 includes a physical transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. According to the disclosed embodiment, each switch transceiver 20 has four independent 10 Mb/s twisted-pair ports and uses 4:1 multiplexing across the serial NRZ interface enabling a four-fold reduction in the number of pins required by the multiport switch 12. Additional details regarding the physical transceiver interface are described below with reference to FIGS. 3A, 3B, 4, and 5.

The multiport switch 12 contains a decision making engine, switching engine, buffer memory interface, configuration/control/status registers, management counters, and MAC (media access control) protocol interface to support the routing of data packets between the Ethernet ports serving the network stations 14 and 16. The multiport switch 12 also includes enhanced functionality to make intelligent switching decisions, and to provide statistical network information in the form of management information base (MIB) objects to an external management entity. The multiport switch 12 also includes interfaces to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 MHz synchronous DRAM having a memory size of 2 or 4 Mb.

The multiport switch 12 also includes a management port 36 that enables an external management entity to control overall operations of the multiport switch 12 by a management MAC interface 38. The management port 36 outputs management frames having at least a portion of a selected received data packet and new information providing management information. The multiport switch 12 also includes a PCI interface 39 enabling access by the management entity via a PCI host and bridge 40. Alternatively, the PCI host and bridge 40 may serve as an expansion bus for a plurality of devices 12.

The multiport switch 12 includes an internal decision making engine that selectively transmits data packets received from one source to at least one destination station. The internal decision making engine may be substituted with an external rules checker. The multiport switch 12 includes an external rules checker interface (ERCI) 42 that allows use of an external rules checker 44 to make frame forwarding decisions in place of the internal decision making engine. Hence, frame forwarding decisions can be made either by the internal switching engine or the external rules checker 44.

The multiport switch 12 also includes an LED interface 46 that clocks out the status of conditions per port and drives LED external logic 48. The LED external logic 48, in turn, drives LED display elements 50 that are human readable. An oscillator 48 provides a 40 MHz clock input for the system functions of the multiport switch 12.

Figure 2:
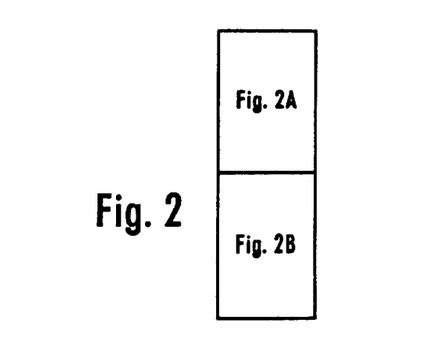
FIGS. 2, 2A and 2B are block diagrams of a multiport switch constructed in accordance with an embodiment of the present invention and used in the packet switched system of FIG. 1.
Figure 2A:
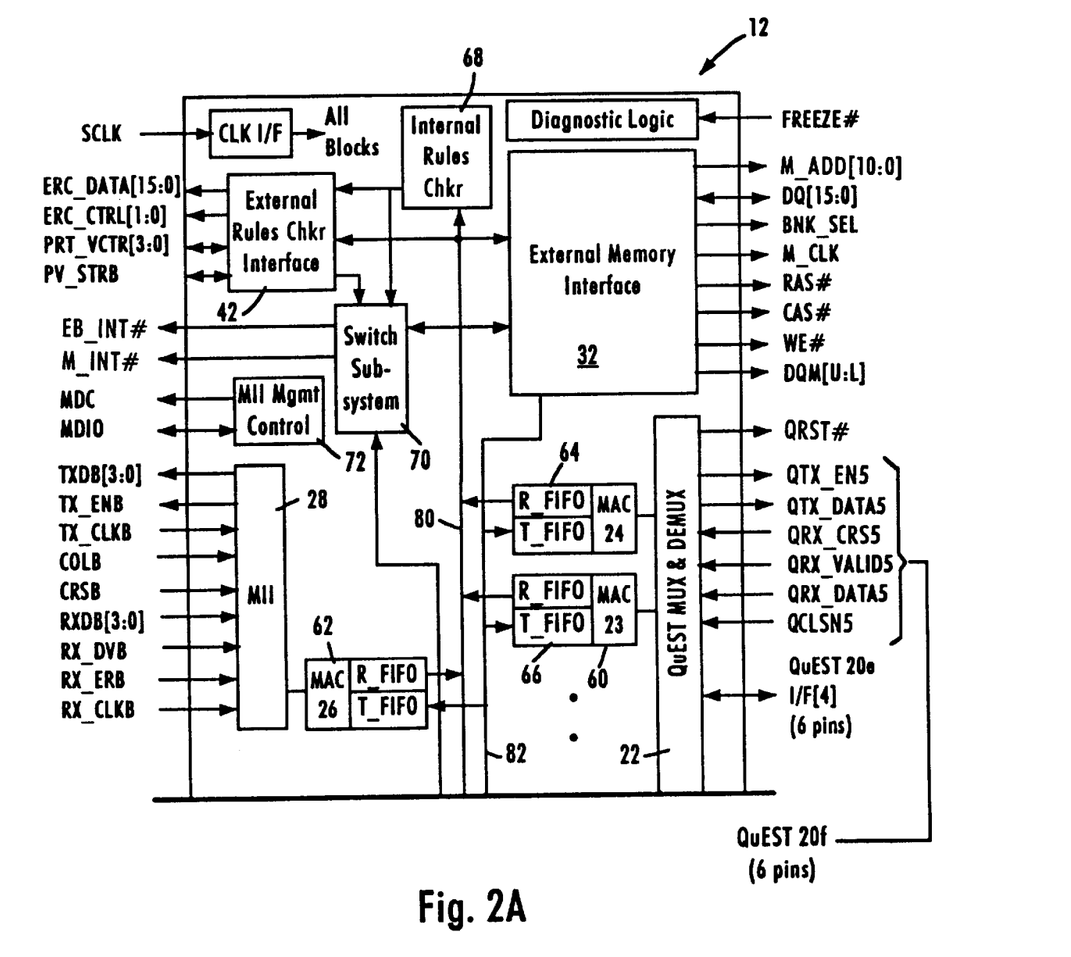
Figure 2B:
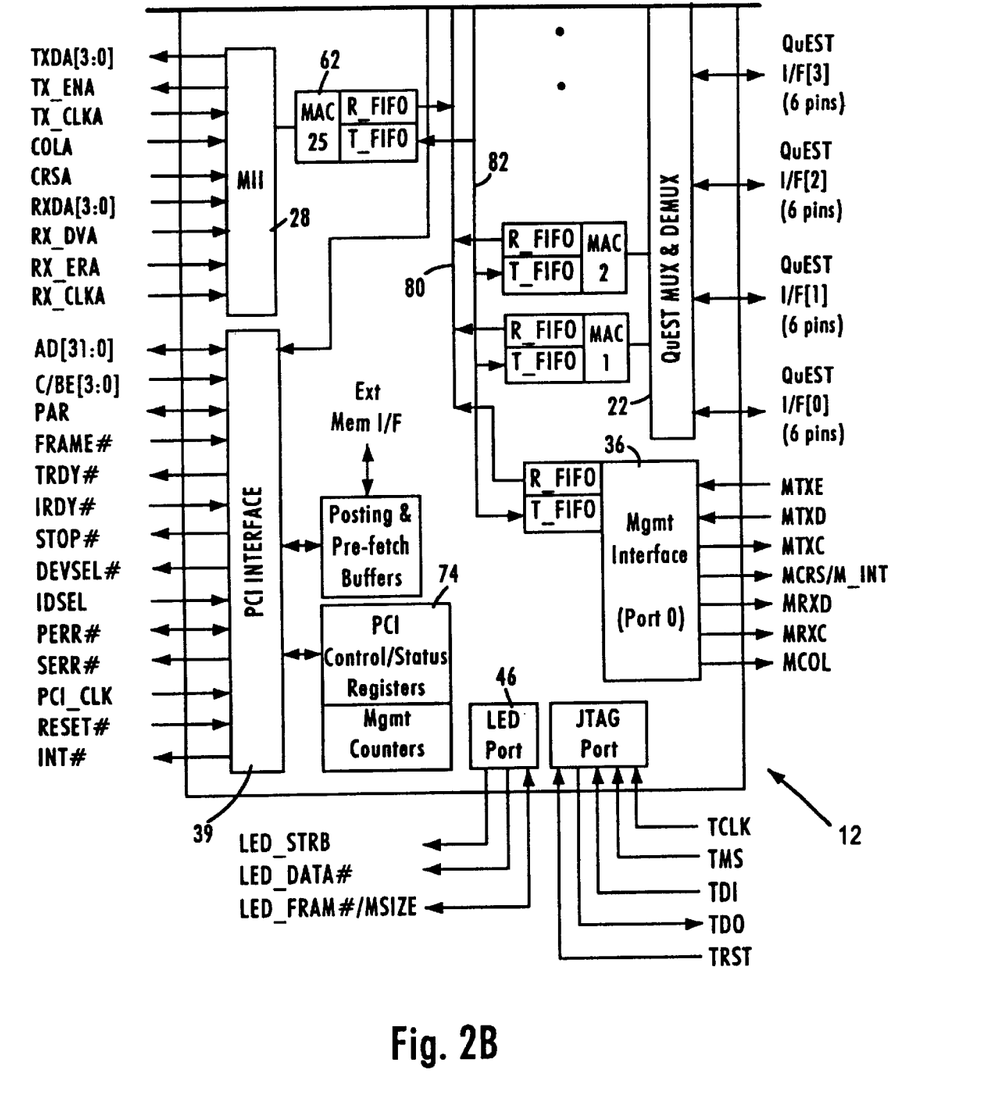

FIG. 2 is a block diagram of the multiport switch 12 of FIG. 1. The multiport switch 12 includes twenty-four (24) 10 Mb/s media access control (MAC) ports 60 for sending and receiving data packets in half-duplex between the respective 10 Mb/s network stations 14 (ports 1–24), and two 100 Mb/s MAC ports 62 for sending and receiving data packets in full-duplex between the respective 100 Mb/s network stations 16 (ports 25, 26). As described above, the management interface 36 also operates according to MAC layer protocol (port 0). Each of the MAC ports 60, 62 and 36 has a receive first in-first out (FIFO) buffer 64 and transmit FIFO 66. Data packets from a network station are received by the corresponding MAC port and stored in the corresponding receive FIFO 64. The received data packet is output from the corresponding receive FIFO 64 to the external memory interface 32 for storage in the external memory 34.

The header of the received packet is also forwarded to a decision making engine, comprising an internal rules checker 68 and an external rules checker interface 42, to determine which MAC ports will output the data packet. Specifically, the packet header is forwarded to an internal rules checker 68 or the external rules checker interface 42, depending on whether the multiport switch 12 is configured to operate using the internal rules checker 68 or the external rules checker 44. The internal rules checker 68 and external rules checker 44 provide the decision making logic for determining the destination MAC port for a given data packet. The decision making engine may thus output a given data packet to either a single port, multiple ports, or all ports (i.e., broadcast). For example, each data packet includes a header having source and destination address, where the decision making engine may identify the appropriate output MAC port based upon the destination address. Alternatively, the destination address may correspond to a virtual address that the appropriate decision making engine identifies as corresponding to a plurality of network stations. Alternatively, the received data packet may include a VLAN (virtual LAN) tagged frame according to IEEE 802.1d protocol that specifies another network (via a router at one of the 100 Mb/s stations 16) or a prescribed group of stations. Hence, either the internal rules checker 68 or the external rules checker 44 via the interface 42 will decide whether a frame temporarily stored in the buffer memory 34 should be output to a single MAC port or multiple MAC ports.

Use of the external rules checker 44 provides advantages such as increased capacity, a random-based ordering in the decision queue that enables frame forwarding decisions to be made before the frame is completely buffered to external memory, and enables decisions to be made in an order independent from the order in which the frames were received by the multiport switch 12.

The decision making engine (i.e., internal rules checker 68 or the external rules checker 44) outputs a forwarding decision to a switch subsystem 70 in the form of a port vector identifying each MAC port that should receive the data packet. The port vector from the appropriate rules checker includes the address location storing the data packet in the external memory 34, and the identification of the MAC ports to receive the data packet for transmission (e.g., MAC ports 0–26). The switch subsystem 70 fetches the data packet identified in the port vector from the external memory 34 via the external memory interface 32, and supplies the retrieved data packet to the appropriate transmit FIFO 66 of the identified ports.

Additional interfaces provide management and control information. For example, a management data interface 72 enables the multiport switch 12 to exchange control and status information with the switch transceivers 20 and the 100 Mb/s physical devices 26 according to the MII management specification (IEEE 802.3u). For example, the management data interface 72 outputs a management data clock (MDC) providing a timing reference on the bidirectional management data I/O (MDI/O) signal path.

The PCI interface 39 is a 32-bit PCI revision 2.1 compliant slave interface for access by the PCI host processor 40 to internal IMS status and configuration registers 74, and access external memory SDRAM 34. The PCI interface 39 can also serve as an expansion bus for multiple IMS devices. The management port 36 interfaces to an external MAC engine through a standard seven-wire inverted serial GPSI interface, enabling a host controller access to the multiport switch 12 via a standard MAC layer protocol.

TIME-MULTIPLEXED OPERATIONS BETWEEN THE PHYSICAL TRANSCEIVER INTERFACE AND THE PHYSICAL TRANSCEIVER

As shown in FIG. 2, the multiport switch uses six (6) pins for each PHY transceiver 20 to send and receive transmit and receive data plus signaling data. The physical transceiver interface 22 multiplexes output data from multiple switch ports 60 into a serial data stream for transmission to one of the physical transceivers 20. The physical transceiver interface 22 and each physical transceiver 20 use a 4:1 time division multiplexed scheme to multiplex data from four interfaces to a transceiver 20 using a single serial interface. The transceiver interface 22 connects the multiport switch 12 to six of the physical (PHY) transceiver devices 20. Each PHY transceiver 20 includes four independent 10 Mb/s twisted pair ports with an optional attachment unit interface (AUI), suitable for coaxial or fiber media attachment unit (MAU). Each of the four ports in the PHY transceiver 20 contains a Manchester encoder/decoder unit, a 10BASE-T transceiver with auto-negotiation and on-chip filtering. Although each PHY transceiver 20 contains four independent 10 Mb/s 10BASE-T ports, data and control information for all four ports is time-division multiplex by the transceiver interface 22 over one serial NRZ interface.

Figure 3A:
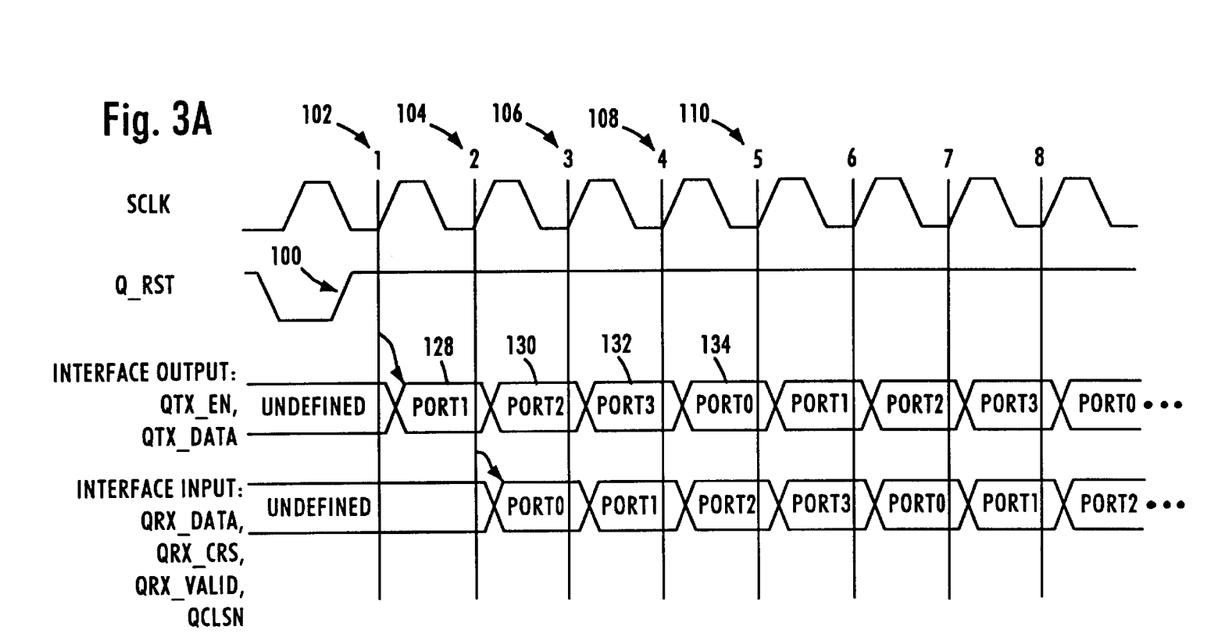
FIGS. 3A and 3B are diagrams illustrating the time-multiplexed operation of the physical transceiver interface of FIGS. 1 and 2 according to an embodiment of the present invention.

FIG. 3A is a timing diagram illustrating the timing operation between the physical transceiver interface 22 and one of the physical transceivers 20 according to an embodiment of the present invention. The transceiver interface 22 outputs two time-multiplexed serial data streams to a corresponding one of the PHY transceivers 20, namely an enable signal (QTX_EN), and a transmit data signal (QTX_DATA). Similarly, the transceiver interface 22 receives four serial data streams from each PHY transceiver 20, namely a receive serial data stream (QRX_DATA), a collision serial stream (QRX_CRS), a receive data valid serial data stream (QRX_VALID), and a collision serial data stream (QCLSN). The physical transceiver interface 22 and the PHY transceivers 20 also share a 40 MHz system clock (SCLK) from the oscillator 30, and the interface 22 outputs a reset signal (Q_RST) to all the PHY transceivers 20 simultaneously. Hence, the transceiver interface 22 is able to communicate send and receive data for four network switch ports 60 using a total of six dedicated signal paths (e.g., pins) where two additional pins are shared for timing signals (SCLK and Q_RST). Although not shown, the transceiver interface 22 also shares with the PHY transceiver devices 20 management data interface signals including a management data clock (MDC) and a management data input/output (MDIO) path.

As shown in FIG. 3A, the transceiver interface 22 and each of the PHY transceiver devices 20 operate according to a prescribed clocking protocol which is shared between the physical transceiver interface 22 and the physical transceivers 20. Specifically, the 40 MHz clock (SCLK) is divided into four clock phases, or time slots, where each slot of the time slot sequence is assigned to a corresponding one of the network switch ports 60. For example, the interface 22 outputs a sequence of time slots carrying packet data for MAC ports 1–4 to PHY device 20a, another sequence of time slots carrying packet data for MAC ports 5–8 to PHY device 20b, another sequence of time slots carrying packet data for MAC ports 9–12 to PHY device 20c, etc.

The transceiver interface 22 and each of the PHY devices 20 also synchronize transmission and reception based upon the prescribed clocking protocol in the repeating sequence of prescribed time slots corresponding to the network switch ports. For example, the deassertion of the Q_RST signal at event 100 (i.e., at the rising edge of Q_RST) causes the transceiver interface 22 and each of the PHY devices 20 to lock into a repeating sequence based upon the 40 MHz system clock (SCLK). The transceiver interface 22 and each of the physical devices 20 share a prescribed clocking protocol of transmitting prescribed sequences of time slots after a prescribed number of SCLK cycles following deassertion of the reset (Q_RST) signal. For example, the transceiver interface 22 begins outputting the first time slot of the sequence after the first rising edge of the system clock (SCLK) at event 102 following deassertion of the reset signal. In addition, both the transceiver interface 22 and the corresponding PHY device 20 will recognize that the transceiver interface 22 will begin output of the prescribed sequence of network switch ports (e.g., port 1 from the sequence 1,2,3,0) after event 102. Similarly, the corresponding PHY device 20 operates according to the prescribed clocking protocol by beginning transmission of the first data bit to the interface 22 after the second rising edge of the system clock following the Q_RST at event 104 according to a second sequence of time slots. Hence, the transceiver interface 22 is configured to repeatedly output the sequence 1,2,3,0 following event 102, and each corresponding PHY device 20 is configured to output the sequence 0, 1, 2, 3 following event 104.

Hence, the transceiver interface 22 and each of the PHY devices 20 are able to transmit time division multiplexed serial data streams according to a shared protocol in response to the SCLK and Q_RST timing signals. Moreover, the SCLK and Q_RST signals synchronize the transceiver interface 22 and the PHY devices 20, enabling each of the devices to anticipate the data for the specified port.

As described above, the transceiver interface 22 outputs a repeating sequence of time slots corresponding to packet data for an assigned group of the network switch ports. For example, the transceiver interface 22 outputs the sequence port 1, port 2, port 3, port 0 at clock cycles 1, 2, 3, and 4, respectively. The sequence for ports 1,2,3,0 is then repeated beginning the fifth clock cycle (event 110) for the next significant bit, described below. Hence, the four clock cycles 1–4 at events 102, 104, 106, and 108 correspond to a single sequence of time slots, e.g., the first sequence of time slots 128, 130, 132, 134. According to the disclosed embodiment, the transceiver interface 22 and each of the PHY devices 20 are configured to output a significant bit from the four assigned switch ports during each corresponding sequence of time slots.

Figure 3B:
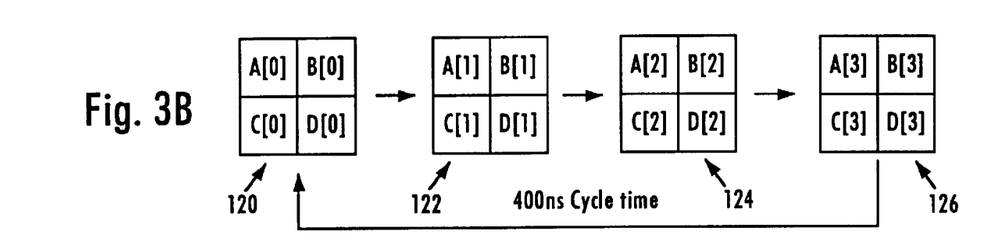

As shown in FIGS. 3A and 3B, the first sequence of time slots 128, 130, 132 and 134 carry data for a corresponding significant bit from the four assigned switch ports. The mapping of data elements into groups of significant bits is illustrated in FIG. 3B, where group 120 corresponds to the least significant bit of data elements A, B, C, and D from ports 1, 2, 3, and 0, respectively. Specifically, each assigned data port outputs a nibble (i.e., half a byte) at a time, such that ports 1, 2, 3, and 0 output data elements A[0:3], B[0:3], C[0:3], and D[0:3], respectively. As described below, the transmit portion includes a parallel load/serial shift register that maps the data elements A, B, C, and D into groups of significant bits for the data elements, where each group includes a corresponding one of the significant bits for each of the data elements A, B, C, and D in a prescribed sequence corresponding to the switch ports. Hence, group 120 includes the (least significant) zero bit A[0], B[0], C[0], D[0], group 122 includes the 1 bits A[1], B[1], C[1], D[1], group 124 corresponds to the 2 bits A[2], B[2], C[2], D[2], and group 126 includes the (most significant) 3 bits A[3], B[3], C[3], D[3].

Hence, the serial data stream QTX DATA first outputs the group 120 of significant bits, where the serial data stream outputs A[0], B[0], C[0], and D[0] during time slots 128, 130, 132, and 134, respectively. Groups 122, 124, and 126 are successively output in the QTX_DATA serial data stream, resulting in a repeating sequence of time slots corresponding to the network switch ports, where each sequence of time slots corresponds to a significant bit of the data elements. Hence, the output of four 4-bit groups over a 400 nanosecond cycle time provides the equivalent 10 MHz data rate over four data ports. Hence, data for four switch ports can be supplied over a single pin by mapping the data elements onto the serial data stream, and outputting the serial data stream at four times the network switch port data rate.

The transceiver interface 22 also outputs to each physical transceiver device 20 a time-multiplexed enable signal (QTX_EN) synchronous with the time-multiplexed data signal (QTX_DATA) carrying a framing signal for each bit for the corresponding port, enabling the corresponding PHY transceiver device 20 to determine whether the data in the corresponding time slot is valid data. Hence, the corresponding physical transceiver device 20 will receive for each network switch port a corresponding stream of framing signals in the QTX_EN serial stream, enabling the corresponding PHY device 20 to identify a start of a packet or an end of a packet by the transition in the framing signal stream from a zero to a 1 and from a 1 to a zero, respectively.

Similarly, the transceiver interface 22 receives from each PHY device 20 four serial data streams carrying data and signaling information, such as carrier-sense, valid data, and collision. Each of the serial data streams received from the corresponding PHY device 20 are synchronous relative to each other, such that each received serial data stream has the same repeating sequence for the corresponding group of network switch ports. Hence, the device interface 22 can determine for each network switch port 60 the beginning of a data frame by the transition of the QRX_VALID data stream for each port from a zero to a 1, indicating the presence of valid data. The transceiver interface 22 can also forward to the corresponding MAC layer the carrier-sense and collision information corresponding to a detected collision condition or the detection of a carrier signal in accordance with IEEE 802.3 protocol.

Figure 4:
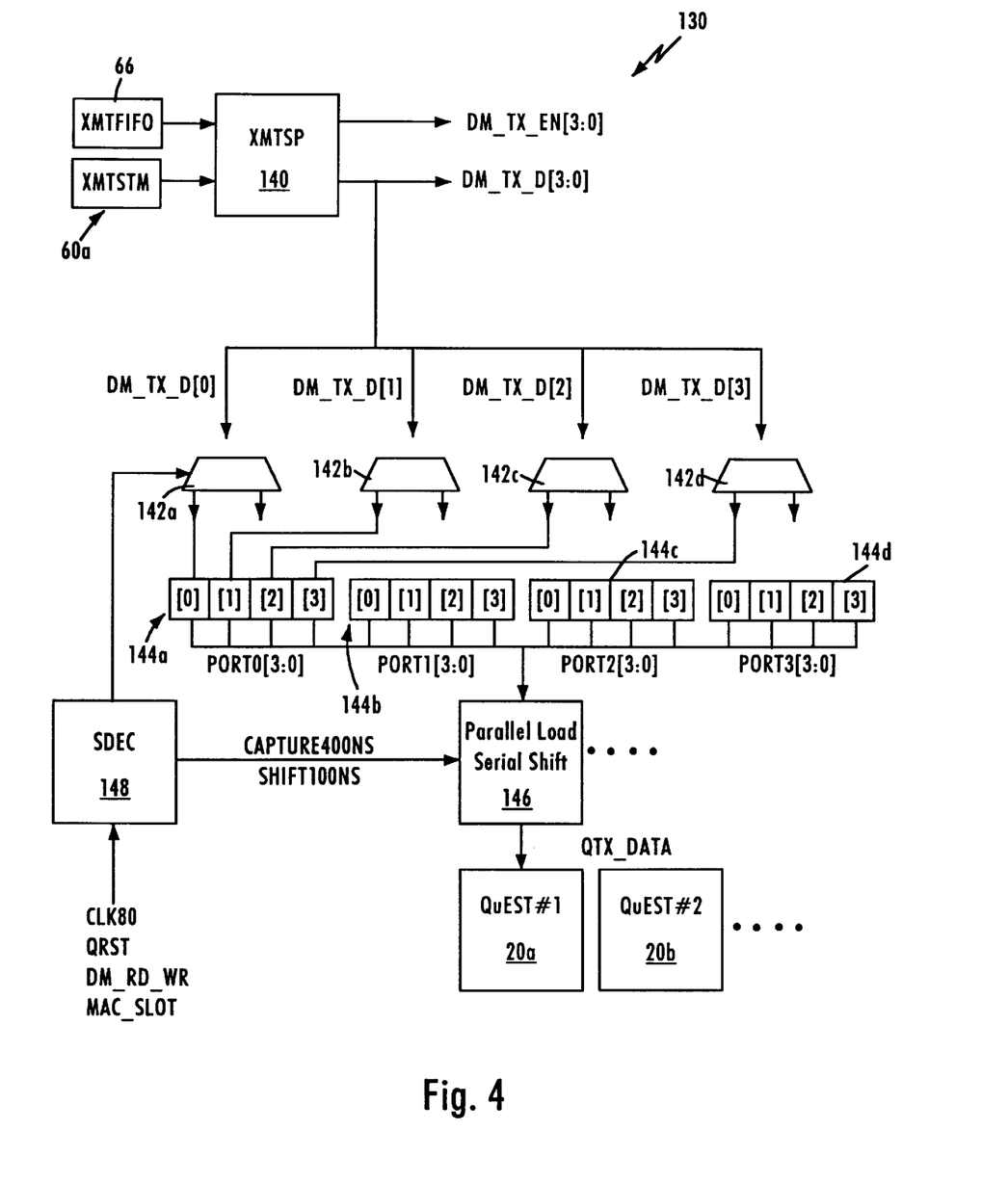
FIG. 4 is a block diagram illustrating in detail a transmit portion of the physical transceiver interface of FIGS. 1 and 2.

FIG. 4 is a block diagram of a transmit portion 130 of the transceiver interface 22 according to an embodiment of the present invention. According to the disclosed embodiment, the 10 MHz switch ports 1–24 connected to the transceiver interface 22 are implemented as a shared state machine 60 having a transmit portion 60a, where the state machine 60 sequentially performs the associated operations for each MAC 60 at a sufficiently high processing rate to emulate 24 10 MHz MAC ports. The transmit state machine 60a sequentially outputs a nibble of data for each switch port in a prescribed sequence to a transmit serial/parallel converter 140, which recovers the nibble-wide transmit data (DM_TX_D[3:0]) and the corresponding enable signal (DM_TX_EN[3:0]), used as a framing signal. The transmit portion 130 includes a transmit serial parallel (XMTSP) converter 140, a series of demultiplexers 142, a group of registers 144, and a parallel load/serial shift register 146. The transceiver interface 22 also includes a start decoder (SDEC) timing circuit 148 configured for synchronizing the transceiver interface 22 and each of the transceivers 20 according to a prescribed clocking protocol based upon the Q_RST signal and the system clock.

As shown in FIG. 4, the start decoder circuit receives an 80 MHz clock and a read-write signal (DM_RD_WR) which qualifies the 80 MHz clock for 40 MHz operation synchronous with the system clock (SCLK). The start decoder 148 also receives a MAC_SLOT signal that specifies which of the switch ports (MAC 1–MAC 24) are currently executed by the transmit state machine 60. The start decoder 148 generates timing signals in order to synchronize the serial data streams output by the transceiver interface 22 to the corresponding PHY transceiver 20. Specifically, each of the MAC switch ports 60 output data at a certain rate, independent of the output rate of the transceiver interface 22. Hence, the start decoder 148 provides the necessary timing signals to synchronize the output data relative to the system clock (SCLK) and the reset signal (Q_RST) according to the prescribed timing protocol, without the necessity of adding buffers.

According to the disclosed embodiment, the start decoder 148 generates a store/select signal to the demultiplexers 142, which in response supply a nibble of data from the transmit serial parallel converter 140 to a selected register 144. As shown in FIG. 4, each register 144 is configured for storing the 4-bit data element from a corresponding network switch port according to the store/select signal output from the start decoder circuit 148. Since the transmit state machine 60 sequentially outputs the data for the twenty-four 10 Mb/s MACs, the store/select signal causes the demultiplexers to store the nibble data output by the transmit serial parallel converter 140 to the corresponding register 144. Although FIG. 4 shows only four demultiplexers 142 and registers 144, additional demultiplexers and registers and shifters 146 will be implemented in parallel for the twenty-four 10 Mb/s switch ports.

The start decoder circuit 148 also outputs a shift signal every 100 nanoseconds which is synchronous with the system clock (SCLK), and a capture signal every 400 nanoseconds which is synchronous with the shift signal. Specifically, the capture signal is a parallel load signal for reading the contents of the registers 144 into the parallel load, serial shift register 146. The start decoder 148 generates the shift signal and the capture signal according to a prescribed clocking protocol, for example by simultaneously generating the capture signal and shift signal 100 nanoseconds after the reset signal (Q_RST) goes high and synchronous with the system clock signal. Hence, the parallel load/serial shift circuit 146 loads the four nibbles of data from the respective four network switch ports in response to the capture signal (i.e., load signal), and the parallel load/serial shift circuit 146 sequentially shifts one of the significant bits from the loaded data elements in the prescribed order corresponding to the repeating sequence of time slots in response to the shift signal.

Specifically, the parallel load/serial shift circuit maps the data elements into the serial data stream (QTX_DATA), by generating one of the groups shown in FIG. 3B in response to a shift signal. Hence, group 120 would be generated in response to the first shift signal, the next group 122 would be generated in response to the next shift signal, etc. Hence, the parallel load serial shift circuit 146 sequentially shifts one of the significant bits from the data elements according to the repeating sequence of time slots to output one of the groups 120, 122, 124, and 126 during each shift signal. As described above, the sequential shifting according to the particular time slot sequence results in a serial data stream outputting a bit for a corresponding port every 25 nanoseconds, resulting in transmission of a nibble of data for four switch ports after sixteen 25 nanosecond clock cycles (i.e., 400 nanoseconds).

Although not shown in FIG. 4, the receive circuit 130 includes a corresponding set of demultiplexers 142, registers 144, and a parallel load serial shift register 146 for the remaining group of four network switch ports. Moreover, the above-described circuitry is also duplicated for the second serial data stream supplying the enable signal (QTX_EN) shown in FIG. 3A.

Figure 5:
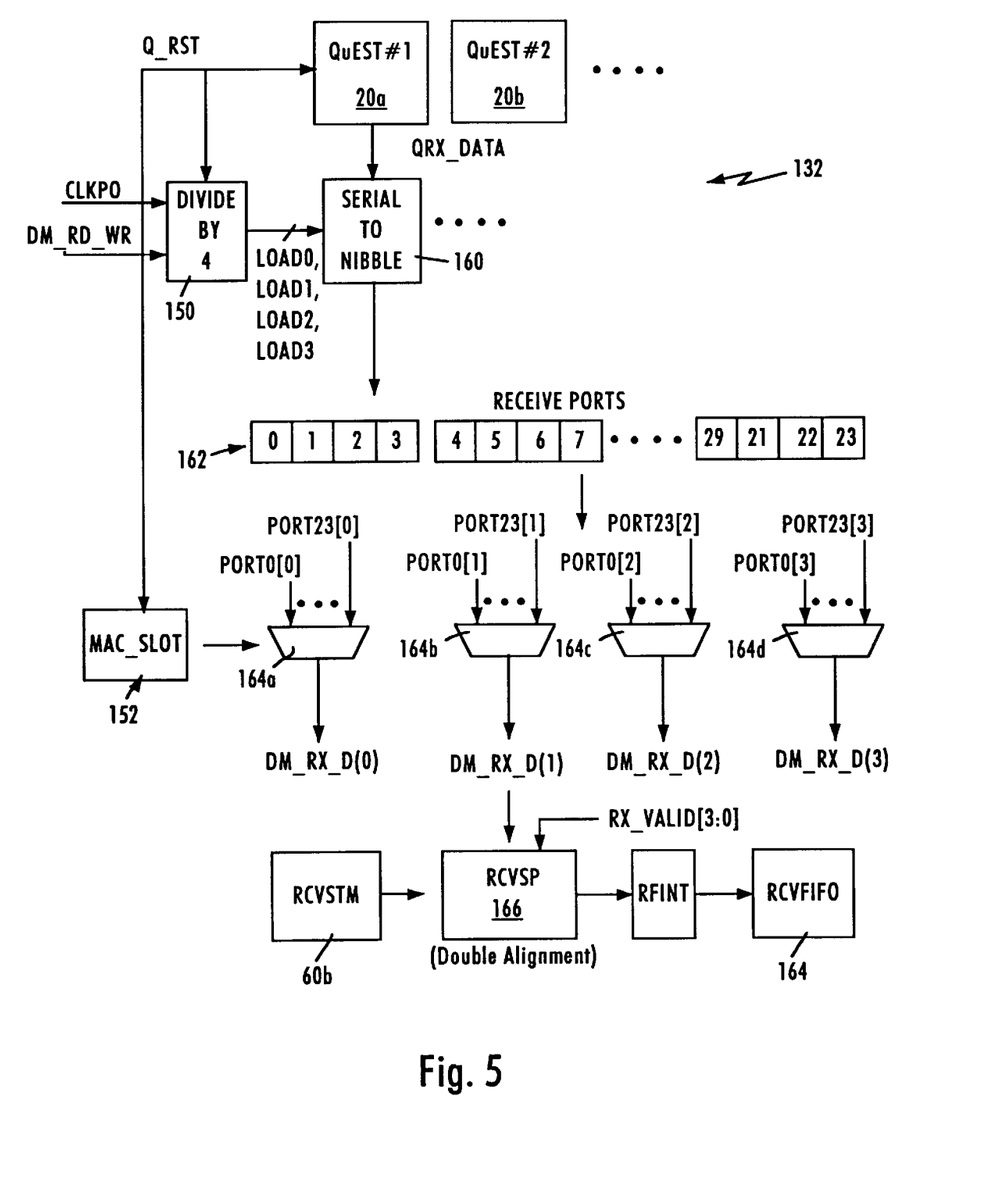
FIG. 5 is a block diagram illustrating in detail the receive portion of the physical transceiver interface of FIGS. 1 and 2.

FIG. 5 is a block diagram illustrating in detail a receive circuit 132 of the transceiver interface 22 according to an embodiment of the present invention. As shown in FIG. 5, the receive circuit 132 includes a serial-to-nibble converter 160, twenty-four 4-bit registers 162, four demultiplexers 164, and a receive serial parallel (RCVSP) alignment circuit 166. FIG. 5 also illustrates a divide-by-four timing circuit 150 and a MAC slot decoder circuit 152, both of which in combination with the start decoder 148 of FIG. 4 form the timing circuit synchronizing the transmit and receive data streams between the transceiver interface 22 and the corresponding PHY transceiver 20.

The serial-to-nibble circuit 160 simultaneously receives a serial data stream (QRX_DATA), a carrier-sense serial stream (QRX_CRS), a data valid serial data stream (QRX_VALID), and a collision serial stream (QCLS) from the corresponding physical transceiver, e.g., PHY device 20a, synchronized with the system clock (SCLK), as shown in FIG. 3A. For simplicity, FIG. 5 illustrates only the demultiplexing of the serial data stream (QRX_DATA). In addition, multiple serial-to-nibble circuits 160 will be used for the respective physical transceivers 20.

The serial-to-nibble circuit 160 receives the serial data stream (QRX_DATA) from the corresponding physical transceiver in a prescribed sequence corresponding to the switch port, as described with respect to FIG. 3A above. Specifically, the clock circuit 150 generates load signals (LOAD 0, LOAD 1, LOAD 2, and LOAD 3) in response to the 80 MHz clock and the read-write signal, used to drive the system clock, and the Q_RST signal. The divide circuit 150 is configured to generate the load signals according to a prescribed clocking protocol, where the load signal sequence is output by the divide circuit at a predetermined interval following deassertion of the Q_RST signal at event 100 in FIG. 3A. Hence, the prescribed protocol enables the circuit 150 to anticipate that the corresponding transceiver 20 will begin to output the serial data stream as a repeating sequence of time slots for the ports 0, 1, 2, 3, etc., enabling the serial-to-nibble converter 160 to perform inverse mapping of the groups of significant bits to recover the nibbles of packet data for each network switch port 0–23 output by the corresponding physical transceiver 20.

Once the serial-to-nibble converter outputs the nibble data to the corresponding receive port registers 162, the contents of the receive port registers 162 are supplied to the multiplexers 164, which sequentially supply each nibble for a corresponding port to the time-shared MAC state machine 60 in response to the MAC slot signal generated by the MAC slot circuit 152. Hence, the multiplexers 164 output a nibble of data for a selected network switch port in response to the MAC slot signal.

The receive serial parallel converter 166 performs double alignment of the nibble for the corresponding network switch port with the corresponding valid data bit to recover the corresponding data packet received by the transceiver. Specifically, the received nibble for the corresponding switch port is received by the physical transceiver 20 in an asynchronous manner, requiring alignment based on comparison with the corresponding nibble of valid data bits (RX_VALID[3:0]). Upon detecting a transition in the RX_VALID data stream from zero to one, the alignment circuit 166 is able to interpret the transition as the beginning of valid data for a new data packet. Although not shown, the alignment circuit 166 will also receive the recovered carrier sense and collision signaling information from the respective serial data streams.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A method for outputting data from a network switch having a plurality of switch ports to a physical transceiver, comprising:

reading from each switch port into a physical transceiver interface a data element having a prescribed number of bits;

mapping the data elements into a first serial data stream having groups of significant bits for the data elements, each group comprising a corresponding one of the significant bits for each of the data elements in a prescribed sequence corresponding to the switch ports; and outputting the first serial data stream from the physical transceiver interface to the physical transceiver based on a prescribed clocking protocol shared between the physical transceiver interface and the physical transceiver.

2. The method of claim 1, wherein the physical transceiver interface includes a plurality of registers for the switch ports, respectively, the reading step comprising:

sequentially reading the data elements from the respective switch ports;

converting the data for each corresponding data element into a parallel data element; and sequentially storing each said parallel data element in the corresponding register.

3. The method of claim 2, wherein the mapping step comprises loading the parallel data elements from the respective registers into a parallel load/serial shift circuit in response to a load signal synchronized with the prescribed clocking protocol.

4. The method of claim 3, wherein the outputting step comprises outputting each group in the first serial data stream according to a shift signal having a first time interval and synchronized with the prescribed clocking protocol, the load signal having a second time interval corresponding to a multiple number of the first time interval based on a number of the switch ports.

5. The method of claim 1, further comprising:

supplying a clock signal to the physical transceiver interface and the physical transceiver;

selectively asserting a reset signal for the physical transceiver interface and the physical transceiver; and starting the prescribed clocking protocol at a prescribed interval relative to the clock signal in response to the selective assertion of the reset signal.

6. The method of claim 5, wherein the outputting step comprises aligning the groups within the first serial data stream with the prescribed clocking protocol based on the clock signal and the reset signal.

7. The method of claim 1, further comprising:

reading from each said switch port a frame signal specifying a presence of valid data within each bit of the corresponding data element;

mapping the frame signals from the respective switch ports into a second serial data stream having significant bit groups, each significant bit group comprising the frame signals for the corresponding significant bits for the respective data elements in said prescribed sequence; and outputting the second serial data stream to the physical transceiver synchronously with the first serial data stream.

8. The method of claim 7, further comprising receiving, according to the prescribed clocking protocol, a third serial data stream from the physical transceiver in a second prescribed sequence corresponding to the switch ports, the third serial data stream including data bits from data packets received by the transceiver and arranged in groups of significant bits for received data packets, each group having the corresponding significant bits arranged in the second prescribed sequence.

9. The method of claim 8, wherein the second prescribed sequence corresponds to the first prescribed sequence by a prescribed time-shifted interval.

10. The method of claim 8, further comprising:

converting the groups of the third serial data stream into respective parallel groups of received significant bits;

supplying the groups of received significant bits to respective multiplexers; and sequentially outputting from the multiplexers a data element for a corresponding one of the switch ports.

11. The method of claim 10, further comprising receiving from the physical transceiver a fourth serial data stream synchronous with the third serial data stream and according to the second prescribed sequence, the fourth serial data stream including valid data bits specifying a presence of valid data for the corresponding bit in the third serial data stream.

12. The method of claim 11, further comprising:

recovering the valid data bits for each said data element of the corresponding one switch port; and aligning said each data element with the corresponding valid data bits to recover the corresponding data packet received by the transceiver.

13. A method comprising:

storing data elements received from respective network switch ports in respective registers, each data element having a prescribed number of bits;

generating an output serial data stream having a repeating sequence of time slots corresponding to the network switch ports, respectively, each sequence of time slots corresponding to a significant bit of the data elements stored in the registers; and outputting the output serial data stream to a physical transceiver based on a prescribed clocking protocol.

14. The method of claim 13, wherein the generating step comprises:

sequentially storing each data element received from the corresponding network switch port into the corresponding register at a first prescribed data rate;

simultaneously loading a serial shift circuit with the data elements stored in the respective registers at a second prescribed data rate corresponding to the first prescribed data rate and a number of the network switch ports; and sequentially shifting one of the significant bits from the data elements in the serial shift circuit according to the repeating sequence of time slots to form the output serial data stream.

15. The method of claim 14, wherein the outputting step comprises initiating the outputting of the sequence of time slots a predetermined interval after termination of a reset signal based on the prescribed clocking protocol.

16. The method of claim 13, further comprising:

receiving an input serial data stream from the physical transceiver based on the prescribed clocking protocol, the input serial data stream having a second repeating sequence of time slots corresponding to packet data received by the physical transceiver for the network switch ports, respectively, each sequence of time slots corresponding to a significant bit of the corresponding packet data;

recovering for each network switch port the corresponding packet data from the input serial data stream;

receiving a signaling serial stream from the physical transceiver having said second repeating sequence of time slots corresponding to a signaling condition for the network switch ports, respectively;

aligning for each network switch port the corresponding packet data based on the corresponding signaling condition from the signaling serial stream.

17. The method of claim 16, further comprising:

receiving a carrier sense serial stream from the physical transceiver having said second repeating sequence of time slots corresponding to a carrier sense condition for the network switch ports, respectively; and recovering the carrier sense conditions for the respective network switch ports based on the prescribed clocking protocol.

18. The method of claim 16, further comprising:

receiving a collision serial stream from the physical transceiver having said second repeating sequence of time slots corresponding to a detected collision condition for the network switch ports, respectively; and recovering the detected collision conditions for the respective network switch ports based on the prescribed clocking protocol.

19. An interface for a network switch having network switch ports, comprising:

a transmit portion configured for outputting a first serial data stream having a first repeating prescribed sequence of time slots corresponding to data output from the respective network switch ports, each first sequence of time slots corresponding to a significant bit of the data from the network switch ports, the transmit portion outputting the serial data stream to a physical transceiver according to a prescribed clocking protocol;

a receive portion configured for receiving from the physical transceiver a second serial data stream having a second repeating prescribed sequence of time slots corresponding to packet data for the respective network switch ports, the receive portion outputting the packet data for the respective network switch ports based on the second repeating prescribed sequence of time slots and the prescribed clocking protocol; and a timing circuit for synchronizing the first and second serial data streams relative to the interface and the physical transceiver according to the prescribed clocking protocol and the physical transceiver.

20. The interface of claim 19, wherein the transmit portion comprises:

a plurality of registers for storing data elements having a prescribed number of bits from the network switch ports, respectively; and a parallel load/serial shift circuit configured for loading the data elements stored in the registers in response to a load signal from the timing circuit, the parallel load/serial shift circuit generating said first serial data stream, in response to a shift signal from the timing circuit, by sequentially shifting one of the significant bits from the loaded data elements according to the repeating sequence of time slots.

21. The interface of claim 20, wherein the timing circuit operates according to the prescribed clocking protocol by generating the shift signal at a prescribed interval following a supplied reset pulse in response to a supplied clock signal.

22. The interface of claim 19, wherein the receive portion is configured for receiving from the physical transceiver a third serial data stream having said second repeating prescribed sequence of time slots corresponding to validity data for the respective packet data, the receive portion comprising:

a serial to parallel converter configured for generating, from the second serial data stream, a group of parallel data from one of the second repeating prescribed sequence of time slots;

a plurality of demultiplexers for the significant bits of the packet data, respectively, each demultiplexer outputting the corresponding significant bit for a selected one of the network switch ports in response to a network switch port selection signal.

23. The interface of claim 22, wherein the receive portion comprises four of said demultiplexers for outputting a nibble of the packet data in response to the network switch port selection signal.

* * * * *